United States Patent
Chen et al.

(10) Patent No.: US 9,568,570 B2
(45) Date of Patent: Feb. 14, 2017

(54) BODY COIL FOR MAGNETIC RESONANCE IMAGING

(71) Applicants: Yan Li Chen, Shenzhen (CN); Yu Tang, Shenzhen (CN); Markus Vester, Nürnberg (DE); Jian Min Wang, ShenZhen (CN); Zhibin Li, Shenzhen (CN)

(72) Inventors: Yan Li Chen, Shenzhen (CN); Yu Tang, Shenzhen (CN); Markus Vester, Nürnberg (DE); Jian Min Wang, ShenZhen (CN); Zhibin Li, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 633 days.

(21) Appl. No.: 14/062,329

(22) Filed: Oct. 24, 2013

(65) Prior Publication Data

US 2014/0117990 A1    May 1, 2014

(30) Foreign Application Priority Data

Oct. 25, 2012   (CN) .......................... 2012 1 0413910

(51) Int. Cl.
  *G01R 33/34*   (2006.01)
  *G01R 33/28*   (2006.01)

(52) U.S. Cl.
  CPC ....... *G01R 33/34076* (2013.01); *G01R 33/288* (2013.01)

(58) Field of Classification Search
  CPC .................. G01R 33/34076; G01R 33/288
  See application file for complete search history.

(56) References Cited

U.S. PATENT DOCUMENTS

| 6,404,201 B1* | 6/2002 | Boskamp ......... G01R 33/34076 324/318 |
| 7,242,193 B2 | 7/2007 | Feiweier |
| 8,035,384 B2 | 10/2011 | Saha |
| 2008/0161675 A1 | 7/2008 | Harvey et al. |
| 2009/0256569 A1* | 10/2009 | Hancu .............. G01R 33/34061 324/314 |

(Continued)

FOREIGN PATENT DOCUMENTS

| CN | 1313512 A | 9/2001 |
| CN | 101726714 A | 6/2010 |
| CN | 101896830 A | 11/2010 |

OTHER PUBLICATIONS

Chinese Office Action for related Chinese Application No. 201210413910.3 mailed Oct. 29, 2015.

*Primary Examiner* — Rodney Bonnette
(74) *Attorney, Agent, or Firm* — Lempia Summerfield Katz LLC

(57) ABSTRACT

A body coil includes a first end ring and a second end ring provided at two ends thereof. The first end ring and the second end ring are connected to each other with a plurality of legs. The first end ring or the second end ring has a structure with the current flow width in a direction parallel to the axis thereof being greater than that in a direction perpendicular to the axis thereof. Since the effective action width of the current is increased in the axial direction and the centralized flow of the current in the end ring is reduced, the local specific absorption rate of radio frequency induced by the magnetic field is therefore reduced.

20 Claims, 5 Drawing Sheets

(56) References Cited

U.S. PATENT DOCUMENTS

| | | |
|---|---|---|
| 2010/0102817 A1 | 4/2010 | Saha |
| 2010/0253333 A1 | 10/2010 | Zhai et al. |
| 2012/0025833 A1* | 2/2012 | Iwama .................. G01R 33/34 |
| | | 324/322 |
| 2012/0268132 A1* | 10/2012 | Zhu ....................... G01R 33/34 |
| | | 324/322 |

* cited by examiner

BODY COIL FOR MAGNETIC RESONANCE IMAGING

RELATED APPLICATIONS

This application claims the benefit of Chinese Patent Application No. CN 201210413910.3, filed Oct. 25, 2012, the entire contents of which are hereby incorporated herein by reference.

TECHNICAL FIELD

The present embodiments relate to the field of magnetic resonance imaging equipment, and particularly, to a body coil for applying an electromagnetic field used in magnetic resonance imaging equipment.

BACKGROUND

In a magnetic resonance imaging (MRI) system, specific absorption rate (SAR) is a safety indicator. Since specific absorption rate is in proportion to the square of the field intensity, specific absorption rate is a critical problem in a magnetic resonance imaging system with a high field intensity. A body coil is a critical component for transferring energy. Relatively high local specific absorption rate means that the average radio frequency power applied to the body coil is to be limited, but the limiting will increase the scanning time. Hence, it is very important to reduce the local specific absorption rate with respect to the design of body coils for magnetic resonance imaging systems with high field intensities.

FIG. 1 is a schematic diagram of a body coil with an end ring structure for magnetic resonance imaging equipment in the prior art. As shown in FIG. 1, reference numeral 101 indicates a cylinder for housing a patient in magnetic resonance imaging equipment. 102 indicates a bird-cage body coil, and there is an end ring 103 and 104 respectively at each of the two ends of the bird-cage body coil. 105 indicates a leg (e.g., metal strip) for connecting two end rings, and 106 indicates that there is a capacitor at a position on each end ring between two metal strips.

In a high-pass bird-cage body coil structure, the worst situation is where the local specific absorption rate of radio frequency is located near the end ring. The design of the end ring is a critical factor to reduce local specific absorption rate.

The reasons for relatively high local specific absorption rate may be divided into two aspects. One is electric field coupling, and the other is magnetic field coupling. Usually, a method for solving the problem of relatively high local specific absorption rate is to reduce the electric field coupling effect. A first method is to replace each capacitor on the end ring with two or more capacitors connected in series. Such a method may be used to lower the voltage across each capacitor that will reduce the electric field coupling effect. A second method is to add foam underneath the end ring that will change the dielectric constant of the material between the end ring and the patient. A third method is to increase the distance between the end ring and the patient. All the above-mentioned methods are on the basis of reducing electric field coupling, but these methods have problems such as high costs, loss of internal space of the cylinder, and so on. Moreover, if the local specific absorption rate is dominated by the magnetic field, the above-mentioned methods may not have the desired effects.

SUMMARY AND DESCRIPTION

The scope of the present invention is defined solely by the appended claims, and is not affected to any degree by the statements within this summary.

The present embodiments may obviate one or more of the drawbacks or limitations in the related art. For example, in some embodiments, a body coil for magnetic resonance imaging equipment may be improved to reduce the local specific absorption rate of radio frequency.

A first aspect proposes a body coil for magnetic resonance imaging equipment. The body coil includes a first end ring and a second end ring provided at two ends thereof, with the first end ring and the second end ring being connected to each other with a plurality of legs. The first end ring and/or the second end ring have a structure with the current flow width in a direction parallel to the axis thereof being greater than that in a direction perpendicular to the axis thereof.

In the body coil according to one embodiment, the structure is such that the first end ring and/or the second end ring comprise a plurality of rings arranged in parallel in the axial direction thereof. The sum of the current flow widths of said plurality of rings of the first end ring in the direction parallel to the axis is greater than that in the direction perpendicular to the axis, and the sum of the current flow widths of said plurality of rings of the second end ring in the direction parallel to the axis is greater than that in the direction perpendicular to the axis.

In the body coil according to one embodiment, there are intervals among said plurality of rings.

In the body coil according to one embodiment, the structure is such that the first end ring and/or the second end ring comprise a ring. The current flow width of the ring in the direction parallel to the axis is greater than that in the direction perpendicular to the axis.

In the body coil according to one embodiment, a plurality of capacitors is connected in the first end ring and the second end ring.

In the body coil according to one embodiment, the first end ring and the second end ring are complete circular rings or partial circular rings.

In the body coil according to one embodiment, the first end ring and the second end ring are complete elliptic rings or partial elliptic rings.

In the body coil according to one embodiment, the first end ring and/or the second end ring have the circular or elliptic structure at certain positions.

Another aspect proposes magnetic resonance imaging equipment. A body coil as discussed above is included in the equipment.

Since in the end ring of the body coil, the effective action width of the current is increased in the axial direction and the centralized flow of the current in the end ring is reduced, the local specific absorption rate of radio frequency induced by the magnetic field is therefore reduced.

BRIEF DESCRIPTION OF THE DRAWINGS

In order to make the above and other features and advantages more apparent, preferred embodiments are described in detail hereinafter by referring to the accompanying drawings, in which.

DETAILED DESCRIPTION

According to some embodiments, a body coil for magnetic resonance imaging equipment is provided. The body coil proposed according to the embodiments may include: a first end ring and a second end ring provided at two ends thereof in the axial direction. The first end ring and the second end ring are connected to each other with a plurality of legs. The first end ring or the second end ring has a structure with the current flow width in a direction parallel to the axis thereof being greater than that in a direction perpendicular to the axis thereof.

In the end ring of the body coil in one embodiment, by way of increasing the flow width of the current in the axial direction and reducing the centralized flow of the current in the end ring, the local specific absorption rate of radio frequency induced by the magnetic field is therefore reduced.

Figure 1:
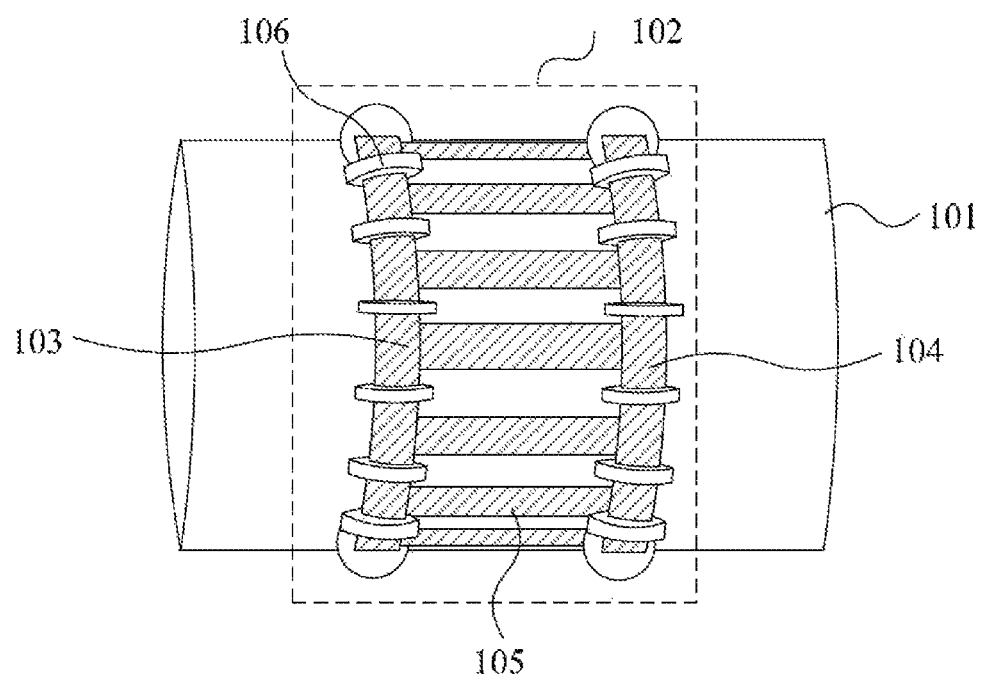
FIG. 1 is a schematic diagram of a body coil in the prior art.
Figure 2:
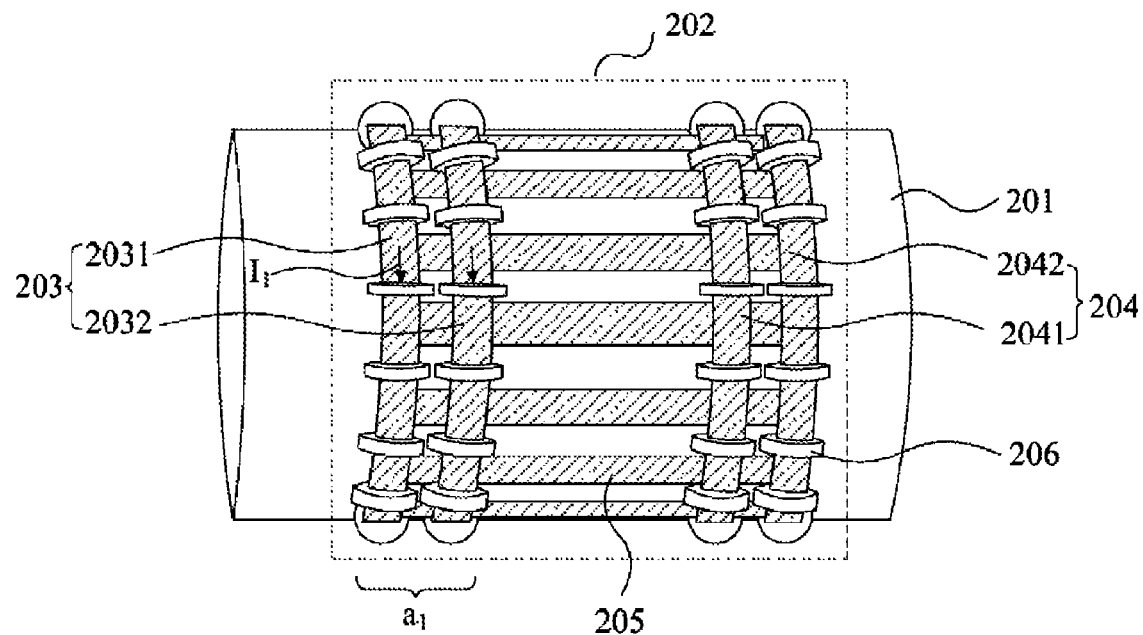
FIG. 2 is a schematic diagram of a body coil having an end ring structure according to a first embodiment.
Figure 3:
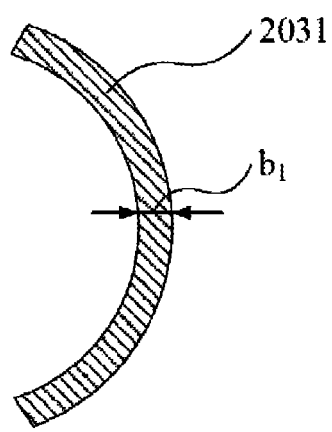
FIG. 3 is a cross-section view of one embodiment of an end ring in a direction perpendicular to the axis.

FIG. 2 is a schematic diagram of a body coil having an end ring structure according to a first embodiment. As shown in FIG. 2, reference numeral 201 indicates a cylinder for housing a patient in magnetic resonance imaging equipment. 202 indicates a body coil for emitting an electromagnetic field to the cylinder 201. The body coil 202 is provided outside the cylinder 201 in the axial direction. The body coil 202 has a double number of end rings (i.e., at two ends of the body coil 202, each end has a group of end rings 203 (first end rings) and 204 (second end rings), while each group of end rings 203 and 204 respectively has two parallel rings 2031, 2032 and 2041, 2042). In this embodiment, there are intervals among these end rings 203, 204. Feed points are provided on two groups of end rings 203 and 204 for exciting a required electromagnetic field. In this embodiment, since the number of end rings 203, 204 is increased in the axial direction of the body coil 202, the width a1 of the current $I_1$ of the first end ring 203 and the second end ring 204 flowing along a loop in the axial direction is increased (as shown in FIG. 2). The increased width $a_1$ is greater in size than the width $b_1$ (the thickness of the end ring) of the current of the first end ring 203 and the second end ring 204 flowing along a loop in a direction perpendicular to the axis, as shown in FIG. 3. (i.e., the first end ring 203 or the second end ring 204 has a structure with the current flow width $a_1$ in the direction parallel to the axis is greater than the current flow width $b_1$ in the direction perpendicular to the axis.

In this embodiment, in other words, the structure of the first end ring 203 or the second end ring 204 with the current flow width in the direction parallel to the axis being greater than the current flow width in the direction perpendicular to the axis refers to the fact that the first end ring 203 or the second end ring 204 includes two rings provided in parallel in the axial direction. The sum $a_1$ of the current flow widths of two rings 2031 and 2032 of the first end ring 203 in the direction parallel to the axis is greater than the current flow width $b_1$ in the direction perpendicular to the axis, and the sum of the current flow widths of two rings 2041 and 2042 of the second end ring 204 in the direction parallel to the axis is greater than the current flow width $b_1$ in the direction perpendicular to the axis.

Reference numeral 205 indicates a plurality of legs for connecting each group of end rings 203 and 204. Since each ring is provided outside the cylinder 201 in the circumferential direction, the legs 205 are provided at the periphery of the cylinder 201 evenly in the circumferential direction. The legs 205 and the end rings 203 and 204 may be made of a good conductor material (e.g., copper sheet) or other conducting circuits. According to some embodiments, legs of other shapes and other dispositions (e.g., dispose legs unevenly in the circumferential direction) may be provided.

Reference numeral 206 indicates a capacitor provided (e.g., connected) on each end ring 203 and 204. The capacitor 206 may be provided at the interval position between two legs. These capacitors 206 may be any kind of capacitors. For example, the capacitors 206 may be fixed capacitors and may also be variable capacitors, and so on. These capacitors 206 are connected to corresponding rings 2031, 2032, 2041 and 2042.

According to some embodiments, the interval size among the legs and the number of capacitors provided in each interval may be disposed according to any known data. In addition, the capacitors are not limited to being located at the interval positions among the legs, but may be disposed at the connection positions of the legs and end rings, or other positions on the legs. According to another embodiment, as a capacitor has been provided on the end ring, a corresponding capacitor may also be provided at an appropriate position of the leg 205 (e.g., providing at the middle position of the leg 205).

According to the above-mentioned embodiments, the above-mentioned first end ring 203 and second end ring 204 may be complete circular rings or partial circular rings as a whole, or may be complete elliptic rings or partial elliptic rings. According to the above-mentioned embodiments, the multi-ring structure (e.g., two rings) included in the first end ring 203 or the second end ring 204 may be complete circular rings or partial circular rings respectively, or may be complete elliptic rings or partial elliptic rings. That is, all the above-mentioned plurality of rings 2031, 2032, 2041, 2042 may be applied in the circumferential direction, and may also be only applied locally to the body coil, so as to reduce the local relative absorption rate. For example, all the above-mentioned plurality of rings 2031, 2032, 2041, 2042 may be only provided on ¼ perimeter of the end ring or a perimeter of another size. As another example, some end rings of the above-mentioned plurality of rings 2031, 2032, 2041, 2042 (e.g., end ring 2031 and/or 2042) are only provided on ¼ perimeter of the end ring (or a perimeter of another size). In these examples, the remaining of the above-mentioned plurality of rings are still provided on the entire perimeter. The application range of a plurality of end rings does not limit the embodiments.

According to the above-mentioned embodiments, other shapes of the above-mentioned plurality of rings 2031, 2032, 2041, 2042 may be used. For example, the particular shape thereof may be circle (circular ring), ellipse (elliptic ring), triangle, square, rectangular, lozenge, track or various arc structures, or a combination of different portions of the above-mentioned various regular shapes.

The body coil according to the above-mentioned embodiments employs a structure with a double number of end rings, and the current on each ring is about half of the structure with a single end ring. Therefore, the magnetic field coupling on each end ring will be reduced due to the reduction in current, thereby reducing the local specific absorption rate of radio frequency.

Figure 4:
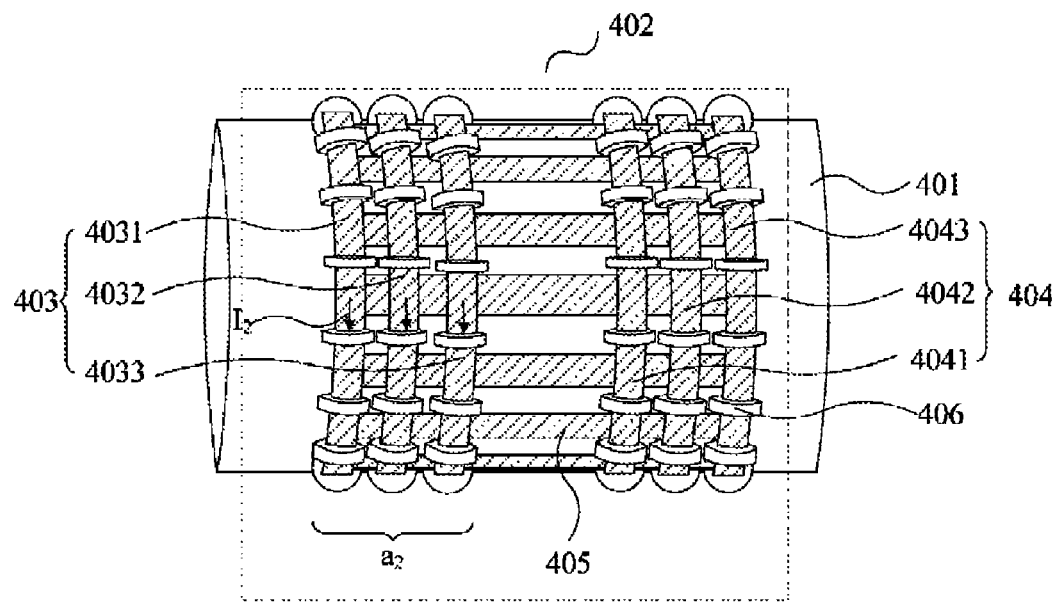
FIG. 4 is a schematic diagram of a body coil having an end ring structure according to a second embodiment.

FIG. 4 is a schematic diagram of a body coil having an end ring structure according to a second embodiment. As shown in FIG. 4, reference numeral 401 indicates a cylinder for housing a patient in magnetic resonance imaging equipment. 402 indicates a body coil, and the body coil 402 is provided outside the cylinder 301 in the axial direction. The body coil 402 has a structure with a triple number of end rings (i.e., at two ends of the body coil 402, each end has a group of end rings 403 (first end rings) and 404 (second end rings), while each group of end rings 403 and 404 respectively has three parallel rings 4031, 4032, 4033, and 4041, 4042, 4043). In this embodiment, there are intervals among these end rings. Feed points are provided on two groups of end rings 403 and 404 for exciting a required electromagnetic field.

In this embodiment, since the number of end rings is increased in the axial direction of the body coil 402, the width $a_2$ of the current $I_2$ of the first end ring 403 and the second end ring 404 flowing along a loop in the axial direction is increased (as shown in FIG. 4). The increased width $a_2$ is greater in size than the width of the current of the first end ring 403 and the second end ring 404 flowing along a loop in a direction perpendicular to the axis (the thickness $b_1$ of the end ring). In other words, the first end ring 403 or the second end ring 404 has a structure with the current flow width in the direction parallel to the axis that is greater than the current flow width in the direction perpendicular to the axis.

In this embodiment, in other words, the structure of the first end ring 403 or the second end ring 404 with the current flow width in the direction parallel to the axis being greater than the current flow width in the direction perpendicular to the axis refers to the fact that the first end ring 403 or the second end ring 404 includes three rings provided in parallel in the axial direction. The sum a2 of the flow widths of the current $I_2$ of three rings 4031, 4032 and 4033 of the first end ring 403 in the direction parallel to the axis is greater than the current flow width $b_1$ in the direction perpendicular to the axis, and the sum of the current flow widths of three rings 4041, 4042 and 4043 of the second end ring 404 in the direction parallel to the axis is greater than the current flow width b1 in the direction perpendicular to the axis.

Reference numeral 405 indicates a plurality of legs for connecting each group of end rings. Each ring is provided outside the cylinder 401 in the circumferential direction, and these legs are provided at the periphery of the cylinder 401 evenly in the circumferential direction. The legs 405 and the end rings 403 and 404 may be made of a good conductor material (e.g., copper sheet) or other conducting circuits. According to some embodiments, other shapes and distributions may be provided (e.g., dispose the legs unevenly in the circumferential direction).

Reference numeral 406 indicates a capacitor provided on each end ring 403 and 404 by way of connection, which may be provided at the interval position between two legs 505. These capacitors 406 may be any kind of capacitors, for example, the capacitors 406 may be fixed capacitors and may also be variable capacitors, and so on. These capacitors 406 are connected to corresponding rings 4031, 4032, 4033, 4041, 4042, and 4043.

According to some embodiments, any interval size among the legs 405 and any number of capacitors 406 provided in each interval may be used. In addition, the capacitors 406 are not limited to being located at the interval positions among the legs 405, but may also be disposed at the connection positions of the legs 405 and each ring, or other positions on the legs 405. As the capacitor 406 has been provided on each ring, a corresponding capacitor 406 may also be provided in an appropriate position of the leg 405 (e.g., the middle position of the leg 405).

Said plurality of rings 4031, 4032, 4033, 4041, 4042 and 4043 and said plurality of legs 405 according to the above-mentioned embodiments are made of good conductors. For example, the rings and legs may be made of cooper sheet and so on and may be other conducting circuits.

According to the above-mentioned embodiments, the above-mentioned first end ring 403 and second end ring 404 may be complete circular rings or partial circular rings as a whole, or may be complete elliptic rings or partial elliptic rings. According to the above-mentioned embodiments, the multi-ring structure (three rings) included in the first end ring 403 or the second end ring 404 may also be complete circular rings or partial circular rings respectively, or may be complete elliptic rings or partial elliptic rings. That is, all the above-mentioned plurality of rings 4031, 4032, 4033, 4041, 4042, and 4043 may be applied in the circumferential direction, and may be only applied locally to the body coil, so as to reduce the local relative absorption rate. For example, all the above-mentioned plurality of rings 4031, 4032, 4033, 4041, 4042, and 4043 may be only provided on ¼ perimeter of the end ring or a perimeter of another size, or some end rings of the above-mentioned plurality of rings 4031, 4032, 4033, 4041, 4042, and 4043 (e.g., end ring 4031 and/or 4042) are only provided on ¼ perimeter of the end ring or a perimeter of another size. In these examples, the remaining of the above-mentioned plurality of rings are still provided on the entire perimeter. The application range of a plurality of end rings does not limit the present embodiments.

According to the above-mentioned embodiments, the particular shape of the above-mentioned plurality of rings 4031, 4032, 4033, 4041, 4042, and 4043 does not limit the scope. For example, the particular shape thereof may be circle (circular ring), ellipse (elliptic ring), triangle, square, rectangular, lozenge, track or various arc structures, or a combination of different portions of the above-mentioned various regular shapes.

The body coil according to the above-mentioned embodiments employs a structure with a triple number of end rings, and the current on each ring is about ⅓ of the situation of the structure with a single end ring. Due to the reduction of the current, the magnetic field coupling on each end ring will also be reduced, which can reduce the local specific absorption rate of radio frequency.

According to some embodiments, the number of rings included in each group of two groups of end rings at two ends of the body coils 202 and 402 is not limited to two or three, but there may be more as long as the number may be realized in the structure of the magnetic resonance imaging equipment in the art.

Figure 5:
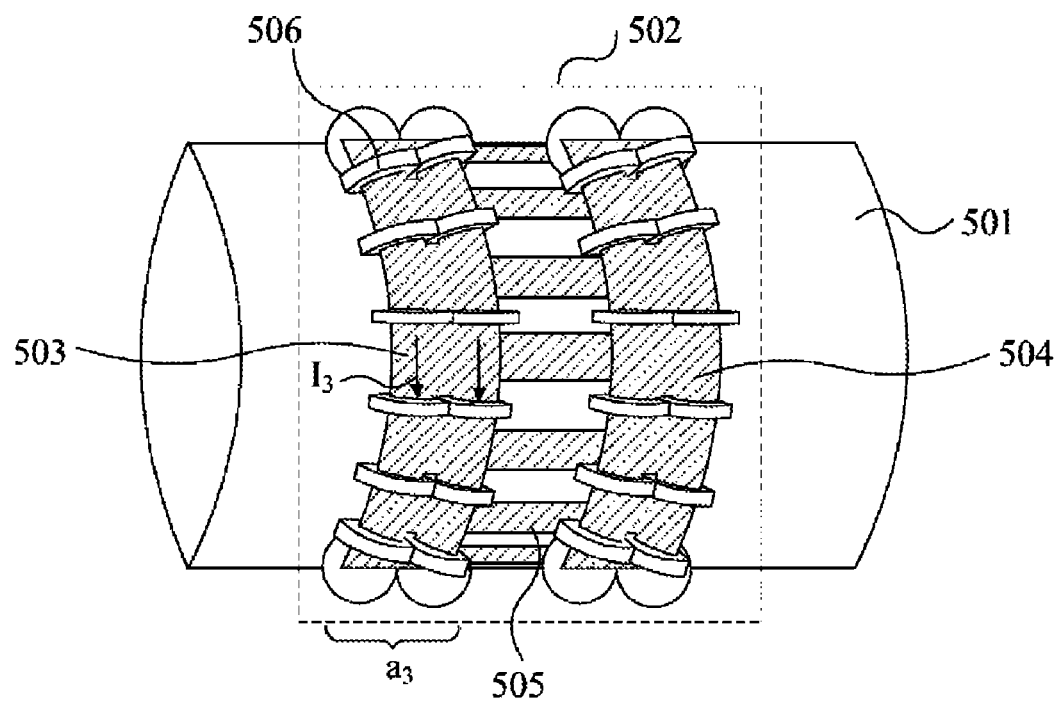
FIG. 5 is a schematic diagram of a body coil having an end ring structure according to a third embodiment.

FIG. 5 is a schematic diagram of a body coil having an end ring structure according to a third embodiment. As shown in FIG. 5, reference numeral 501 indicates a cylinder for housing a patient in magnetic resonance imaging equipment. 502 indicates a body coil for exciting an electromagnetic field, and the body coil 502 is provided outside the cylinder 501 in the axial direction. The body coil 502 has an end ring 503 (first end ring) and an end ring 504 (second end ring), which are respectively located at either end of the body coil 502. The widths of the first end ring 503 and the second end ring 504 in the axial direction are increased by a predetermined size or multiple (e.g., increased by once, twice, triple, or more). For example, in the conventional technology, the width of the end ring is set to be about 50 mm, but in some embodiments, the width of the end ring is set as about 75 mm, 100 mm, 125 mm, 150 mm, 175 mm, 200 mm, etc., or even wider. A feed point is provided on two end rings 403 and 404, respectively, for applying electricity from a power source to the body coil 402 so as to apply an electromagnetic field to the interior of the body coil 402 (in the cylinder 401). In this embodiment, since the width of the end ring is increased in the axial direction of the body coil 502, the width $a_3$ of the current $I_3$ of the first end ring 503 and the second end ring 504 flowing along a loop in the axial direction is increased as shown in FIG. 5. The increased width $a_3$ is greater in size than the width of the current of the first end ring 503 and the second end ring 504 flowing along a loop in a direction perpendicular to the axis (the thickness of the end ring). The first end ring 503 or the second end ring 504 has a structure with the current flow width in the direction parallel to the axis being greater than the current flow width in the direction perpendicular to the axis.

In this embodiment, in other words, the structure of the first end ring 503 or the second end ring 504 with the current flow width in the direction parallel to the axis being greater than the current flow width in the direction perpendicular to the axis refers to the fact that the width of the first end ring 503 or the second end ring 504 is increased in the axial direction. The sum $a_3$ of the current flow width of the first end ring 503 in the direction parallel to the axis is greater than the current flow width $b_1$ in the direction perpendicular to the axis, and the sum of the current flow width of the second end ring 504 in the direction parallel to the axis is greater than the current flow width $b_1$ in the direction perpendicular to the axis.

Reference numeral 505 indicates a plurality of legs for connecting each end ring 503 and 504. The two end rings are provided outside the cylinder 501 in the circumferential direction, and the legs 505 are provided at the periphery of the cylinder 501 evenly in the circumferential direction. The legs 505 and the end rings 503 and 504 may be made of a good conductor material (e.g., copper sheet) or other conducting circuits. According to some embodiments, any shape and any distribution of the legs 505 (e.g., dispose the legs unevenly in the circumferential direction) may be used.

Reference numeral 506 indicates a capacitor provided on each end ring 503 and 504 by way of connection. The capacitor 506 may be provided at the interval position among the legs 505. These capacitors 506 may be any kind of capacitors. For example, the capacitors 506 may be fixed capacitors and may be variable capacitors, and so on. These capacitors 506 are connected to the end rings 503 and 504.

According to some embodiments, more capacitors may be connected in series in the axial direction on the basis of the originally provided capacitor 506 with the increase of the widths of the end rings 503 and 504. For example, when the widths of the end rings 503 and 504 are increased once, a capacitor 506 will be connected in parallel in the axial direction on the originally provided capacitor 506. When the widths of the end rings 503 and 504 are increased twice, two capacitors 506 will be connected in parallel in the axial direction on the originally provided capacitor 506. When the widths of the end rings 503 and 504 are increased triple, three capacitors 506 will be connected in parallel in the axial direction on the originally provided capacitor 506.

The size of the interval between two legs 505, any number of capacitors provided in each interval and any number of capacitors 506 connected in parallel in the axial direction with the increase of the end ring width may be provided. In addition, the capacitors 506 are not limited to being located at the interval positions among the legs 505, but may be disposed at the connection positions of the legs 505 and the end rings 503 and 504, or other positions on the legs 505. According to another embodiment, if a capacitor 506 has been provided on the end rings 503 and 504, a corresponding capacitor 506 may also be provided at an appropriate position of the legs 505 (e.g., the middle position of the legs 505).

According to some embodiments, the increase of the width of each of the end rings 503 and 504 at two ends of the body coil 502 is not limited to once, twice, or triple, but may be a larger multiple, and may be a non-integer multiple, as long as the increase may be realized in the structure of the magnetic resonance imaging equipment in the art.

According to some embodiments, the above-mentioned predetermined multiple of capacitors 506 are connected in parallel in the axial direction on the first end ring 503 and the second end ring 504. For example, when the widths of the end rings 503 and 504 are increased by n times, n capacitors 506 are connected in series again in the axial direction on the originally provided capacitor 506. Here, n can be any real number.

According to the above-mentioned embodiments, the above-mentioned first end ring 503 and second end ring 504 may be complete circular rings or partial circular rings, or may be complete elliptic rings or partial elliptic rings. That is, all the above-mentioned end rings 503 and 504 may be applied in the circumferential direction, and may be only applied locally to the body coil, so as to reduce the local relative absorption rate. For example, all the above-mentioned end rings 503 and 504 may be provided on the entire perimeter of the end ring, or only provided on a partial perimeter of the end ring (e.g., ¼ perimeter), and one of the above-mentioned end rings 503 and 504 may be provided on a partial perimeter of the end ring (e.g., ¼ perimeter) and the other one is still provided on the entire perimeter. The application range of each end ring does not limit the present embodiments. According to the above-mentioned embodiments, any shape of the above-mentioned end rings 503 and 504 may be provided. For example, the particular shape thereof may be circle (circular ring), elliptic (elliptic ring), triangle, square, rectangular, lozenge, track or various arc structures, or a combination of different portions of the above-mentioned various regular shapes.

The body coil according to the above-mentioned embodiments employs a structure of an end ring with an increased axial width, and the current on the end ring is reduced compared to the situation of a structure of an end ring with a non-increased width. Therefore, the magnetic field coupling on each end ring will also be reduced, thereby being able to reduce the local specific absorption rate of radio frequency.

According to the above-mentioned various embodiments, a plurality of capacitors may be connected in parallel in the axial direction on the first end ring and the second end ring with respect to the structure having an increased effective current flow width in the axial direction, as can be seen in FIG. 2, FIG. 4 and FIG. 5. Hence, the effect of reducing the local specific absorption rate of radio frequency is further realized.

According to another embodiment, the first end ring and the second end ring may have different sizes, and may be formed into other asymmetric shapes and sizes. The symmetry of the two end rings does not limit the scope of the present embodiments.

According to another embodiment, magnetic resonance imaging equipment employing a body coil as described in the above-mentioned various embodiments may be provided. In such magnetic resonance imaging equipment, other various components, units, etc. may employ the same components, units, etc. as in the magnetic resonance imaging equipment in the prior art with a mere difference in the structure of the body coil applying an electromagnetic field.

In the magnetic resonance imaging equipment according to the above-mentioned embodiments, since the number of end rings in the axial direction is increased and the width of the end ring and the body coil of the structure are increased to reduce or disperse the current in the situation of a structure with a single end ring, the magnetic field coupling on the end ring is also reduced, thereby reducing the local specific absorption rate of radio frequency.

Hereinafter, the effects of body coils with a structure of a double number of end rings and a structure of a single end ring will be compared on the basis of simulation experiment results.

In this simulation experiment, a flesh model is placed under an end ring to test the local specific absorption rate of radio frequency, which model is placed right underneath the end ring and covers half of the cylinder in the circumferential direction.

Figure 6A:
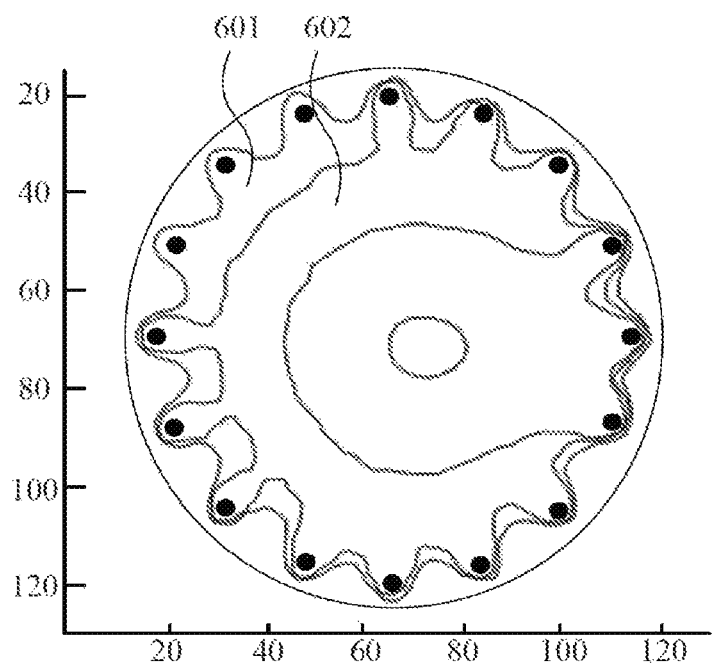
FIGS. 6a and 6b are magnetic field distribution diagrams of one embodiment using the body coil as shown in FIG. 1 in the prior art.
Figure 6B:
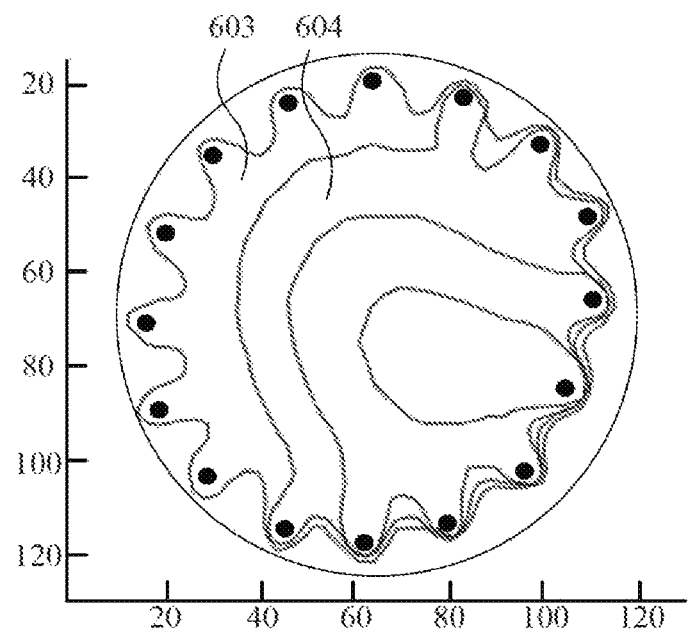

FIGS. 6a and 6b are magnetic field distribution diagrams of a body coil using a structure with a single end ring. In this diagram, the imaged circular pattern is a magnetic field distribution diagram observed along the cross section of the cylinder for housing the patient in magnetic resonance imaging equipment. The magnetic field distribution is indicated for near the end ring. From the simulation results, the input power of CP (cylindrical excitation) mode (FIG. 6a) of a body coil of a structure with a single end ring is 6581 W, and the input power of EP (elliptic excitation) mode (FIG. 6b) is 11 427 W.

Figure 7A:
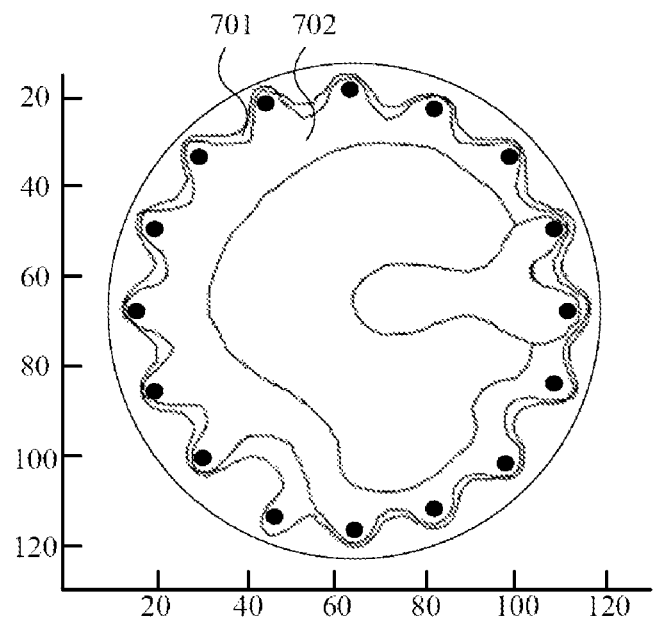
FIGS. 7a and 7b are magnetic field distribution diagrams of one embodiment using the body coil having an end ring structure according to the first embodiment.
Figure 7B:
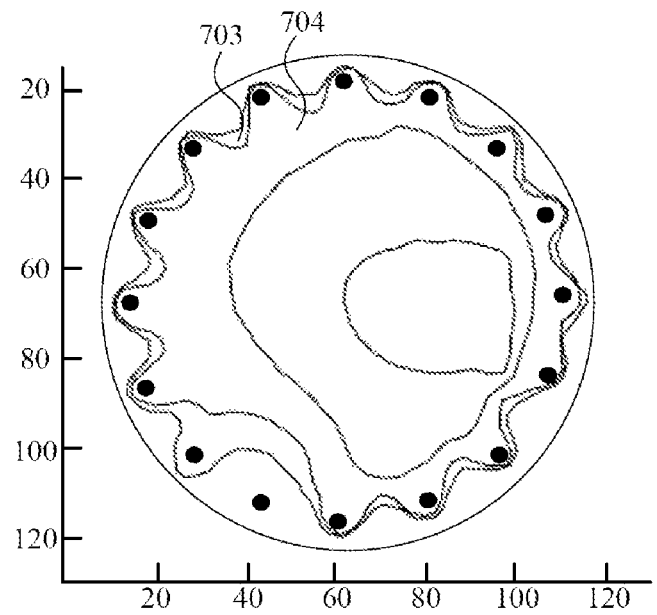

FIGS. 7a and 7b are magnetic field distribution diagrams of a body coil using a structure with a double number of end rings according to some embodiments. In this diagram, the imaged circular pattern is a magnetic field distribution diagram observed along the cross section of the cylinder for housing the patient in magnetic resonance imaging equipment. The magnetic field distribution is indicated for near the end ring. From the simulation results, it can be seen that the input power of CP mode (FIG. 7a) of a body coil of a structure with a double number of end rings is 7564 W, and the input power of EP mode (FIG. 7b) is 10 726 W. From the diagram, it can be seen that the magnetic field of the magnetic resonance system is extremely uniform.

Comparing FIG. 6a to FIG. 7a (CP mode), in FIG. 6a, each black spot arranged in the circumferential direction indicates each capacitor on the end ring, the area 601 thereof in the inward direction is an area with a relatively high specific absorption rate, and the area 602 is an area with a specific absorption rate lower than that of the area 601. Similarly, in FIG. 7a, each black spot arranged in the circumferential direction indicates each capacitor on the end ring, the area 701 thereof in the inward direction is an area with a relatively high specific absorption rate, and the area 702 is an area with a specific absorption rate lower than that of the area 701. From the comparison, it can be seen that the area 701 with a relatively high specific absorption rate in FIG. 7a employing the body coil with a structure having a double number of end rings is greatly reduced, while the area 702 with a relatively low specific absorption rate is greatly increased.

Comparing FIG. 6b to FIG. 7b (EP mode), in FIG. 6b, each black spot arranged in the circumferential direction indicates each capacitor on the end ring, the area 603 thereof in the inward direction is an area with a relatively high specific absorption rate, and the area 604 is an area with a specific absorption rate lower than that of the area 603. Similarly, in FIG. 7b, each black spot arranged in the circumferential direction indicates each capacitor on the end ring, the area 703 thereof in the inward direction is an area with a relatively high specific absorption rate, and the area 704 is an area with a specific absorption rate lower than that of the area 703. From the comparison, it can be seen that the area 703 with a relatively high specific absorption rate in FIG. 7b employing the body coil with a structure having a double number of end rings is greatly reduced, while the area 704 with a relatively low specific absorption rate is greatly increased.

In this simulation result, the lengths of 50% $B_1$ field in two cases are also compared. The length of 50% $B_1$ field refers to, on the axial center line of the body coil, the electromagnetic field intensity attenuation from the highest value to the length of the center line covered by 50% of the range. The length of the entire coil is defined as the distance between the centers of various end rings. In the structure with a double number of end rings, the measured length of 50% $B_1$ field is 68.1% of the length of the entire coil. In the structure with a single end ring, the measured length of 50% $B_1$ field is 68.8% of the length of the entire coil. Here, it can be concluded that if the length of the entire coil does not change, the lengths of 50% $B_1$ fields in the structure with a single end ring and the structure with a double number of end rings remain unchanged.

The improvement of the specific absorption rate in this simulation experiment may also be illustrated by measurement data.

The electric field with the flesh model placed therein is mainly excited by the electromagnetic field of the end ring, which electric field is used for calculating the local specific absorption rate. The above-mentioned particular method for calculating an electric field inside a model from the simulation result and thereby calculating the local specific absorption rate does not limit the present embodiments, and those skilled in the art may employ any method in the prior art to perform calculation.

In the above-mentioned simulation experiment, some positions need to be selected on the model to calculate local absorption rate. Here, for the structure with a single end ring, the selected position just corresponds to the center of the end ring, and for the structure with a double number of end rings, the selected position corresponds to the center of the inner end ring. In the above-mentioned simulation experiment, 5 points with relatively high values in the model are selected according to the above-mentioned positions, and the results are as shown in the following table, wherein each measurement value is an electric field value at each point.

|  | Position point | | | | |
| --- | --- | --- | --- | --- | --- |
|  | 1 | 2 | 3 | 4 | 5 |
| Single end ring | 471.8 | 489.2 | 494.4 | 486 | 493.9 |
| A double | 317.1 | 322.2 | 321.6 | 319.2 | 324.2 |

-continued

|  | Position point | | | | |
|---|---|---|---|---|---|
|  | 1 | 2 | 3 | 4 | 5 |
| number of end rings (inner end ring) | | | | | |
| Improvement rate | 54.8% | 56.6% | 57.7% | 56.9% | 56.9% |

In the above table, the improvement rate is calculated as follows: the improvement rate=1−(electric field value of a double number of end rings/electric field value of a single end ring)$^2$.

As illustrated above, compared to the situation of using a single end ring, the body coil with a structure having a double number of end rings may be used to reduce about 60% of the local specific absorption rate.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding claim—whether independent or dependent—and that such new combinations are to be understood as forming a part of the present specification.

The invention claimed is:

1. A body coil for magnetic resonance imaging equipment, the body coil comprising:
a first end ring; and
a second end ring provided at two ends of the body coil, with said first end ring and said second end ring being connected to each other with a plurality of legs, the first end ring, the second end ring, or both the first and second end rings having a structure with the current flow width in a direction parallel to the axis thereof being greater than that in a direction perpendicular to the axis thereof;
wherein said structure is such that said first end ring, the second end ring, or both the first and second end rings each comprise a plurality of rings arranged in parallel in an axial direction thereof, with a sum of the current flow widths of the plurality of rings in the direction parallel to the axis being greater than that in the direction perpendicular to the axis.

2. The body coil as claimed in claim 1 wherein the plurality of rings share a same current.

3. The body coil as claimed in claim 1, wherein there are intervals among said plurality of rings.

4. The body coil as claimed in claim 1, wherein the structure is such that the first end ring, the second end ring, or both the first and second end rings comprise a ring with the current flow width of the ring in the direction parallel to the axis being greater than that in the direction perpendicular to the axis.

5. The body coil as claimed in claim 1, further comprising a first plurality of capacitors connected in the first end ring and a second plurality of capacitors connected in the second end ring.

6. The body coil as claimed in claim 1, wherein the first end ring and the second end ring are complete circular rings.

7. The body coil as claimed in claim 1, wherein the first end ring and the second end ring are partial circular rings.

8. The body coil as claimed in claim 1, wherein the first end ring and said second end ring are complete elliptic rings.

9. The body coil as claimed in claim 1, wherein the first end ring and the second end ring are partial elliptic rings.

10. The body coil as claimed in claim 1, wherein the first end ring, the second end ring, or the first and second end rings comprise the structure along less than all of a perimeter.

11. Magnetic resonance imaging equipment comprising:
a body coil, wherein the body coil comprises a first end ring and a second end ring provided at two ends of the body coil, with said first end ring and said second end ring being connected to each other with a plurality of legs, the first end ring, the second end ring, or both the first and second end rings having a structure with the current flow width in a direction parallel to the axis thereof being greater than that in a direction perpendicular to the axis thereof;
wherein said structure is such that said first end ring, the second end ring, or both the first and second end rings each comprise a plurality of rinds arranged in parallel in an axial direction thereof, with a sum of the current flow widths of the plurality of rings in the direction parallel to the axis being greater than that in the direction perpendicular to the axis.

12. The magnetic resonance imaging equipment as claimed in claim 11 wherein the plurality of rings share a same current.

13. The magnetic resonance imaging equipment as claimed in claim 11, wherein there are intervals among said plurality of rings.

14. The magnetic resonance imaging equipment as claimed in claim 11, wherein the structure is such that the first end ring, the second end ring, or both the first and second end rings comprise a ring with the current flow width of the ring in the direction parallel to the axis being greater than that in the direction perpendicular to the axis.

15. The magnetic resonance imaging equipment as claimed in claim 11, further comprising a first plurality of capacitors connected in the first end ring and a second plurality of capacitors connected in the second end ring.

16. The magnetic resonance imaging equipment as claimed in claim 11, wherein the first end ring and the second end ring are complete circular rings.

17. The magnetic resonance imaging equipment as claimed in claim 11, wherein the first end ring and the second end ring are partial circular rings.

18. The magnetic resonance imaging equipment as claimed in claim 11, wherein the first end ring and said second end ring are complete elliptic rings.

19. The magnetic resonance imaging equipment as claimed in claim 11, wherein the first end ring and the second end ring are partial elliptic rings.

20. The magnetic resonance imaging equipment as claimed in claim 11, wherein the first end ring, the second end ring, or the first and second end rings comprise the structure along less than all of a perimeter.

* * * * *